United States Patent
DeGraaff (10) Patent No.: US 11,056,997 B2
(45) Date of Patent: Jul. 6, 2021

(54) UNIVERSAL PHOTOVOLTAIC LAMINATE

(71) Applicant: SUNPOWER CORPORATION, San Jose, CA (US)

(72) Inventor: David B. DeGraaff, Mountain View, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/752,836

(22) Filed: Jun. 27, 2015

(65) Prior Publication Data

US 2016/0380584 A1 Dec. 29, 2016

(51) Int. Cl.
*H02S 40/34* (2014.01)
*H02S 40/32* (2014.01)
*H01L 31/049* (2014.01)

(52) U.S. Cl.
CPC ............ *H02S 40/34* (2014.12); *H01L 31/049* (2014.12); *H02S 40/32* (2014.12); *Y02E 10/50* (2013.01)

(58) Field of Classification Search
CPC .......... H02S 40/30; H02S 40/32; H02S 40/34; H02S 40/35; H02S 40/36
See application file for complete search history.

(56) References Cited

U.S. PATENT DOCUMENTS

| | | | |
|---|---|---|---|
| 4,392,009 A * | 7/1983 | Napoli | H01L 31/048 136/244 |
| 5,951,785 A | 9/1999 | Uchihashi et al. | |
| 6,093,884 A * | 7/2000 | Toyomura | E04D 3/366 126/621 |
| 6,201,180 B1 | 3/2001 | Meyer et al. | |
| 6,307,144 B1 * | 10/2001 | Mimura | H01L 31/05 136/244 |
| 6,337,436 B1 | 1/2002 | Ganz | |
| 6,670,541 B2 | 12/2003 | Nagao et al. | |
| 7,625,238 B2 | 12/2009 | Duesterhoeft | |
| 7,762,832 B2 | 7/2010 | Minnick | |
| 7,952,016 B2 | 5/2011 | Higuchi et al. | |
| 8,063,301 B2 | 11/2011 | Hikosaka et al. | |
| 8,203,075 B2 | 6/2012 | Wanqin et al. | |

(Continued)

FOREIGN PATENT DOCUMENTS

| | | |
|---|---|---|
| CN | 202678347 U | 1/2013 |
| CN | 202816981 U | 3/2013 |

(Continued)

OTHER PUBLICATIONS

International Search Report and Written Opinion for PCT Patent Application No. PCT/US16/39111 dated Oct. 12, 2016, 14 pgs.

(Continued)

*Primary Examiner* — Eric R Smith
(74) *Attorney, Agent, or Firm* — Schwabe, Williamson & Wyatt, P.C.

(57) ABSTRACT

A photovoltaic (PV) module can include a PV laminate, a frame coupled to a perimeter of the laminate, a junction box that includes a housing for an electrical connection between a plurality of PV cells of the laminate and a plurality of conductors, and an electronics enclosure coupled to the frame. In embodiments, the electronics enclosure can include electronic circuitry that is electrically coupled to the plurality of conductors and to another photovoltaic module.

21 Claims, 5 Drawing Sheets

(56) References Cited

U.S. PATENT DOCUMENTS

| | | |
|---|---|---|
| 8,435,056 B2 | 5/2013 | Fornage et al. |
| 8,469,735 B2 | 6/2013 | Dargatz |
| 8,516,755 B2 | 8/2013 | Reyal et al. |
| 8,659,880 B2 | 2/2014 | Russell et al. |
| 8,971,046 B2 | 3/2015 | Solon |
| 9,083,121 B2 | 7/2015 | DeGraaff et al. |
| 2008/0149170 A1 | 6/2008 | Hanoka |
| 2008/0283118 A1 | 11/2008 | Rotzoll et al. |
| 2009/0084426 A1 | 4/2009 | Fornage et al. |
| 2010/0139742 A1 | 6/2010 | Wayman et al. |
| 2010/0147362 A1* | 6/2010 | King ............... F24J 2/4614 136/251 |
| 2010/0175753 A1 | 7/2010 | Maeda et al. |
| 2010/0193008 A1 | 8/2010 | Zapf |
| 2010/0275991 A1 | 11/2010 | Chan |
| 2010/0326490 A1 | 12/2010 | Tagliareni et al. |
| 2011/0079284 A1 | 4/2011 | Wu |
| 2011/0192449 A1 | 8/2011 | Higuchi et al. |
| 2012/0031455 A1 | 2/2012 | Yokoyama et al. |
| 2012/0266934 A1* | 10/2012 | Tang ............... H02S 40/34 136/244 |
| 2012/0325288 A1* | 12/2012 | Jang ............... H02J 3/385 136/246 |
| 2013/0092216 A1 | 4/2013 | Yan et al. |
| 2013/0140416 A1* | 6/2013 | West ............... H01L 31/0422 248/222.11 |
| 2013/0203285 A1 | 8/2013 | Solon |
| 2013/0271926 A1 | 10/2013 | Marroquin et al. |
| 2013/0284514 A1 | 10/2013 | Kawaguchi et al. |
| 2014/0182662 A1 | 7/2014 | West et al. |
| 2014/0202523 A1 | 7/2014 | Guo |
| 2014/0285975 A1 | 9/2014 | Solon |
| 2014/0293553 A1 | 10/2014 | Stanelli et al. |
| 2015/0103497 A1* | 4/2015 | Cioffi ............... H02S 40/34 361/729 |
| 2015/0144181 A1 | 5/2015 | Gilchrist et al. |
| 2015/0214889 A1* | 7/2015 | Nam ............... H02S 40/32 136/251 |
| 2016/0118933 A1* | 4/2016 | Russell ............... H02S 40/34 136/251 |

FOREIGN PATENT DOCUMENTS

| | | | |
|---|---|---|---|
| EP | 0793278 A2 | 9/1997 | |
| JP | 2010259319 | 11/2010 | |
| WO | WO-2010144637 A1 * | 12/2010 | ........... H05K 7/1432 |
| WO | WO-2015094778 | 6/2015 | |

OTHER PUBLICATIONS

International Preliminary Report on Patentability from PCT/US2016/039111 dated Jan. 11, 2018, 10 pgs.
Extended European Search Report from European Patent Application No. 16818501.5 dated Jan. 21, 2019, 7 pgs.
First Office Action from Chinese Patent Application No. 2016800387219 dated Nov. 26, 2019, 14 pgs.
Office Action from Japanese Patent Application No. 2017-565762 dated Jul. 27, 2020, 3 pgs.
Official Communication from European Patent Application No. 16818501.5 dated May 19, 2020, 4 pgs.
Second Office Action for Chinese Patent Application No. 2016800387219 dated Sep. 21, 2020, 11 pgs.
Final Notification of Reasons for Refusal from Japanese Patent Application No. 2017-565762 dated Mar. 31, 2021, 5 pgs.
Third Office Action from Chinese Patent Application No. 2016800387219 dated Mar. 23, 2021, 4 pgs.

* cited by examiner

UNIVERSAL PHOTOVOLTAIC LAMINATE

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collect from all of the PV cells can be combined in series and parallel arrangements to provide power with a certain voltage and current.

DETAILED DESCRIPTION

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" conductor does not necessarily imply that this conductor is the conductor in a sequence; instead the term "first" is used to differentiate this conductor from another conductor (e.g., a "second" conductor).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

PV modules can have a greater than forty year lifetime but electronics are not proven for that lifetime. In addition to the lifetime discrepancy, electronics evolve more quickly than panels. Therefore, it is possible that communication or other requirements can change over the lifetime of a module that otherwise renders the installed electronics obsolete. The disclosed embodiments can provide a module-level electronics solution that is plug-and-play such the electronics are quickly and easily field replaceable, which can provide a long-lasting PV module with up-to-date electronics over its lifetime.

Figure 1:
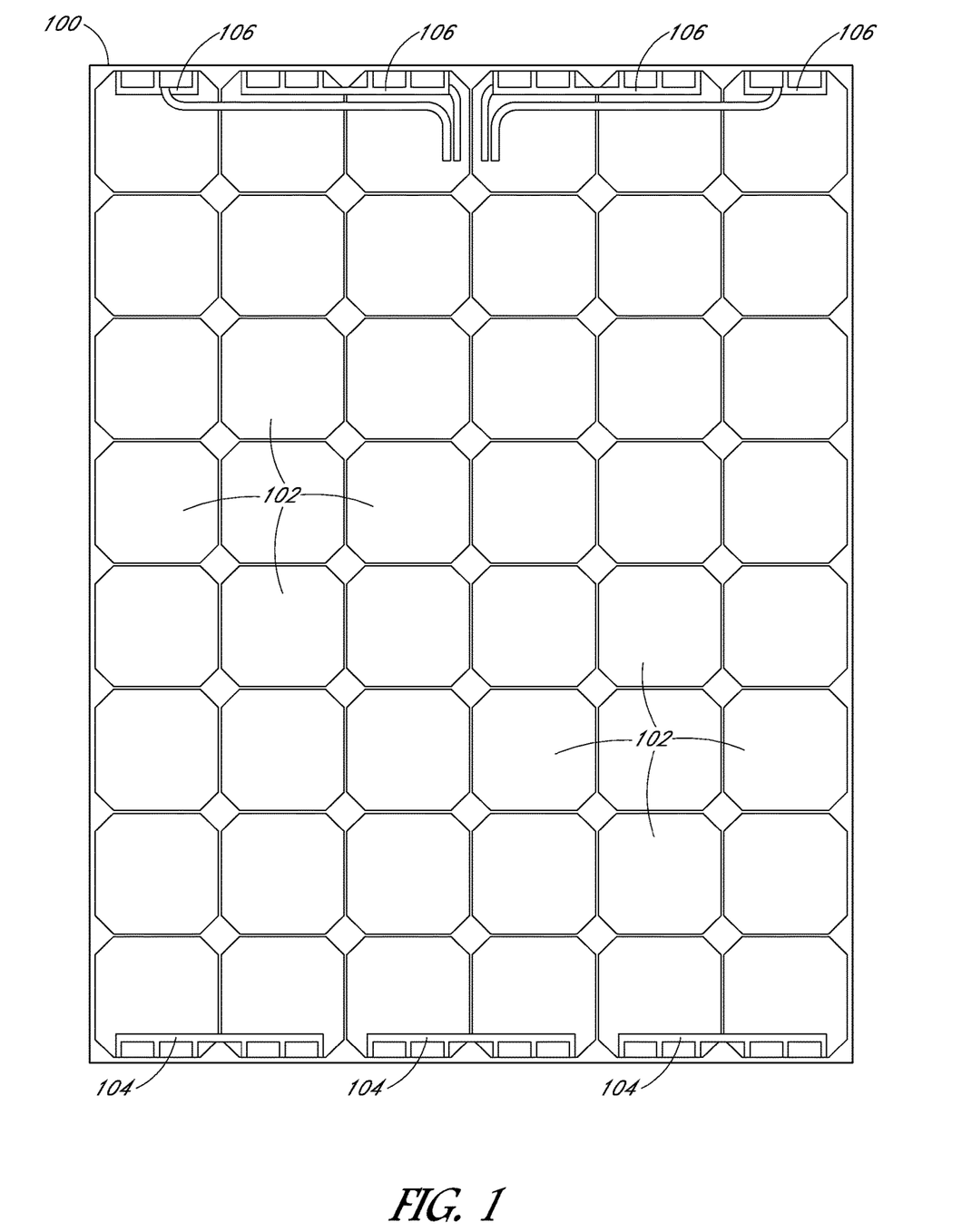
FIGS. 1 and 2 illustrate example photovoltaic (PV) modules with and without a backsheet, according to some embodiments.

Turning now to FIG. 1, an example PV module that can include the disclosed universal laminate features is shown. The PV module can have a front side that faces the sun during normal operation and a back side opposite the front side. The PV module can include a frame and a PV laminate that includes a plurality of PV cells. The PV laminate can include one or more encapsulant layers that surround and enclose the PV cells. A cover (e.g., glass or some other transparent or substantially transparent material) can be laminated to the encapsulant layers. The laminate can have a backsheet that is the backmost layer of the laminate and provides a weatherproof and electrically insulating layer that protects the rest of the laminate. The backsheet can be a polymer sheet, and can be laminated to the encapsulant layer(s) of the laminate, or it can be integral with one of the encapsulant layers.

Figure 3:
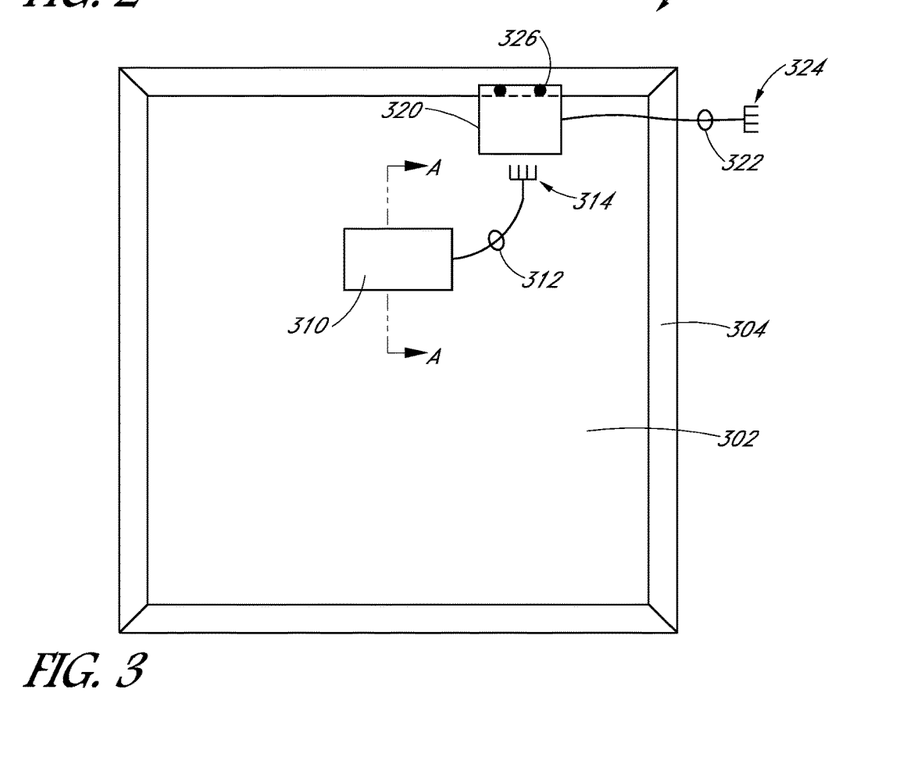
FIG. 3 illustrates an example PV module having a universal laminate, according to some embodiments.
Figure 4:
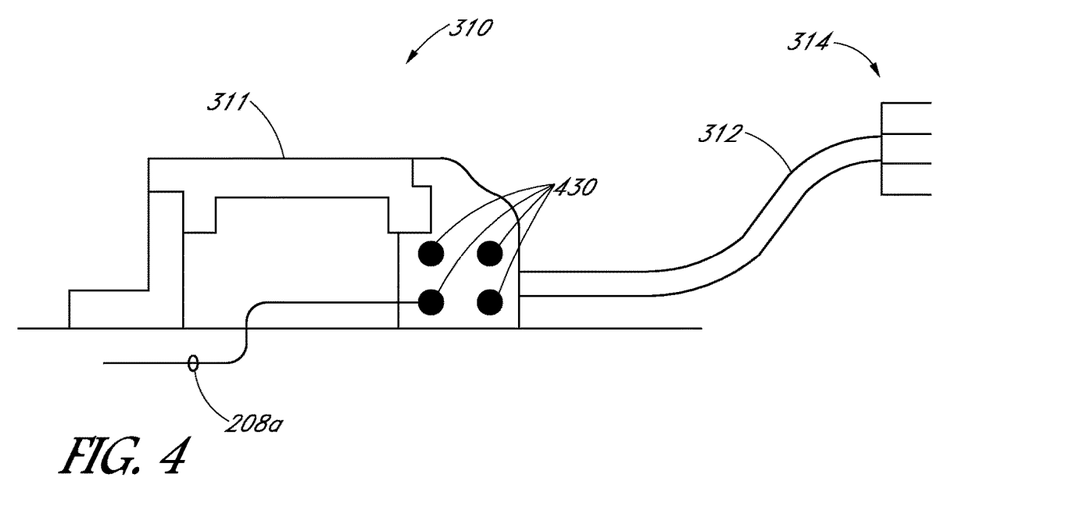
FIGS. 4 and 5 illustrate a cross-sectional view and top-down view, respectively, of an example junction box connection for a universal laminate, according to some embodiments.
Figure 5:
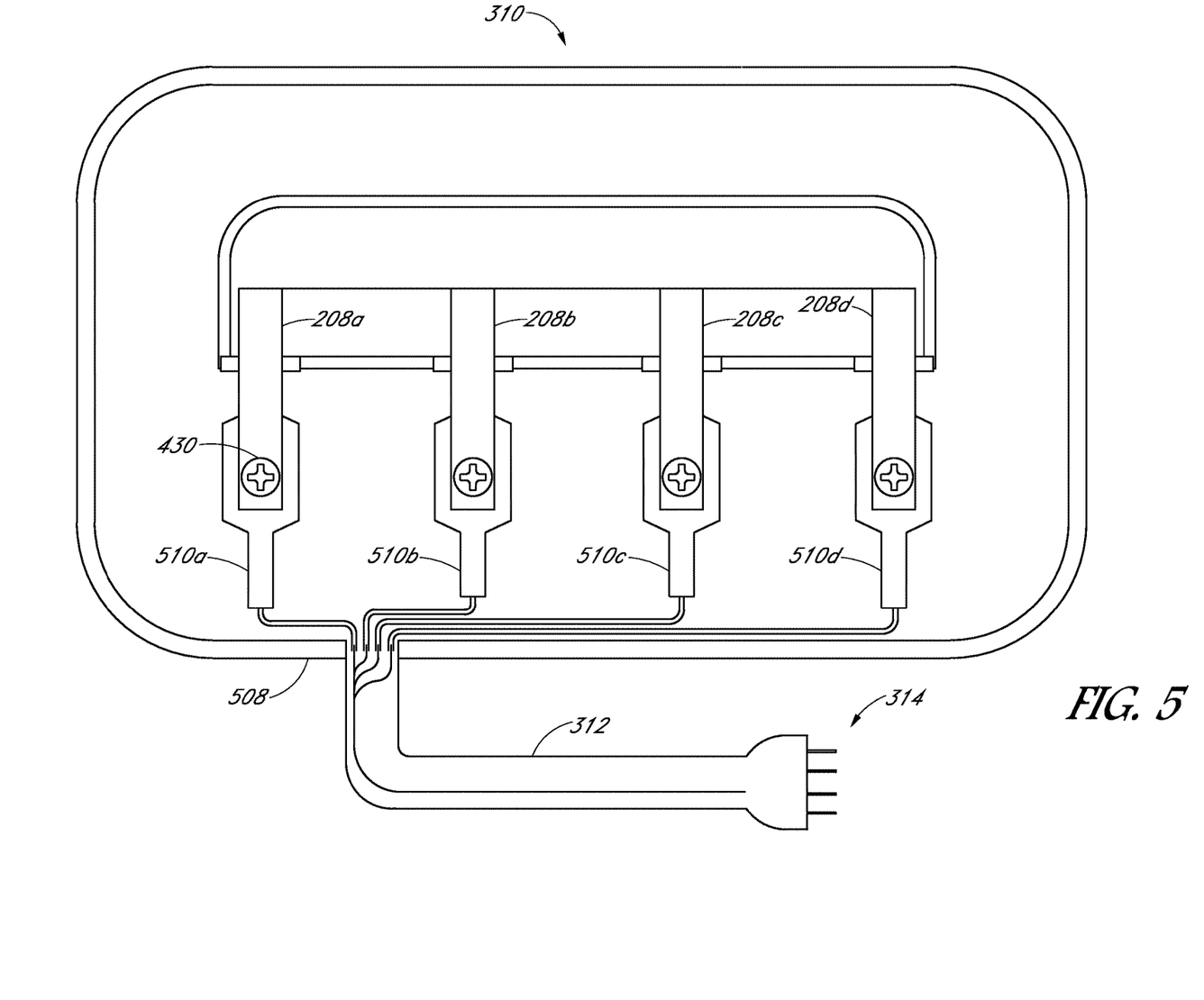

FIG. 1 illustrates the backside of PV module 100. PV module 100 is shown in FIG. 1 without the backsheet for ease of illustration of the PV cells, busbars, and connectors. As shown, PV module 100 can include a number of PV cells 102. Although PV module 100 illustrates an array of 48 PV cells 102, other PV modules include other numbers of PV cells, such as 36 cells, 72 cells, 96 cells, 128 cells, etc. Moreover, not shown in great detail, the six columns of PV cells 102 can be interconnected such that adjacent PV cells 102 within a given column are connected serially to one or more other adjacent PV cells 102 in the column. As shown, groups of two columns of PV cells can be connected serially by cell connection pieces 104. At one end of each column/string of cells, busbars 106 can couple the string of cells electrically to a junction box (e.g., as shown in FIGS. 3-5).

Figure 2:
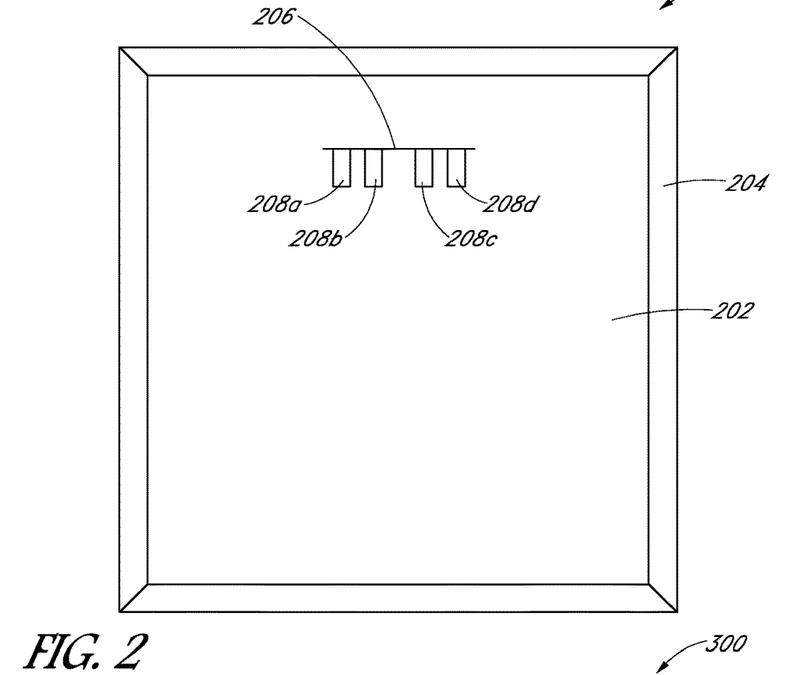

Turning now to FIG. 2, the backside of PV module 200 is illustrated. PV module 200 is similar to or the same as PV module 100 but is illustrated with backsheet 202 covering the PV cells and most of the busbars. Portions of busbars 208a, 208b, 208c, and 208d are shown as penetrating the backsheet at 206 such that the busbars can be accessed and coupled to a junction box. Also illustrated is frame 204 coupled to the perimeter of the PV laminate. Frame 204 can be used for mechanical integrity, grounding, mounting (e.g., mounting of components as described herein, mounting of the module to a structure), among other purposes. Note that although the examples of FIGS. 1 and 2 illustrate four busbars each coupled to a string of solar cells, in other embodiments, fewer or additional busbars can be used.

As one concrete example, in one configuration, for a 60V module, the four busbars, also referred to as ribbons, can correspond to 0V, 15V, 45V, and 60V, respectively. If panels are strung together in series, the voltages can be significantly higher (e.g., up to 1500V). For direct current (DC) applications, the 0V and 60V ribbons can be connected to the (−) and (+) ribbons so the panels can be connected in series. For alternating current (AC) applications, the 0V and 60V ribbons can be connected to the (−) and (+) inputs of a microinverter unit.

In some embodiments, the mid-point voltage (e.g., 30V in the example above) can also be routed from the laminate to a junction box via a ribbon/busbar. Thus, in another example, a three busbar embodiment could correspond to 0V, 30V, and 60V. Or, a five busbar embodiment could correspond to 0V, 15V, 30V, 45V, and 60V.

In another example, the module can be a higher power module, for example, at 600V. In such an example, busbars can include 0V, 300V, 600, among other examples depending on the specific application.

In one embodiment, to enable maximum flexibility for a universal laminate, each substring of PV cells can be independently routed from the laminate to the junction box. In a four substring, 96-cell module example, eight ribbons can be routed from the laminate. Other examples exist.

As described in more detail below, the particular electronics module installed with the PV module can then use or not use all the conductors. For example, if the particular electronics module only needs four of the eight conductors, then the cable and connector/plug interface between the junction box and electronics module can only couple those four conductors to the electronics module (e.g., the four other conductors simply terminate in the plug and are not electrically coupled within the electronics module). As another example, if a certain combination of the substrings is needed (e.g., a connection of the substrings in parallel), such a combination can be done in a cable connecting the junction box to the electronics module, in an adapter between the cable and the electronics module or junction, or within the electronics module itself. Choosing a busbar/ribbon configuration from the laminate to the junction box that provides such flexibility can help ensure the laminate and junction box are universal to work with a variety of electronics and can be compatible with future electronics modules as well.

Turning now to FIG. 3, an example PV module having a universal laminate such that it is compatible with a variety of different module-level electronics is shown. In one embodiment, junction box 310 can be permanently, mechanically coupled to backsheet 302 of the laminate (as shown) or frame 304 of PV module 300. A cover is illustrated over the junction box such that electrical connections between the busbars and conductive rails and conductors are hidden from view in FIG. 3. In typical PV applications, a junction box includes bypass diodes to protect the PV module from overheating. However, in some instances and as noted above, other module electronics can be used instead of electronics that includes bypass diodes. Moreover, according to the disclosed embodiments, manufacturing efficiencies can be gained by making a universal laminate such that, in the module fabrication facility, a simple junction box that includes a housing for an electrical connection between the solar cells and plurality of conductors.

Accordingly, the PV module can be manufactured such that it is configured to plug and play with a variety of types of electronics (e.g., microinverters, DC optimizers, voltage clipping devices, monitoring electronics). Not only can manufacturing efficiencies be achieved but it can also enable the decision of what type of module electronics module further downstream. For instance, the PV module can be universal in the sense that it can be used with voltage clipping electronics, microinverter electronics, among other examples, without such electronics being hardwired or permanently attached to the module. In some embodiments, the electronics enclosure can even be installed in the field, can be field replaceable (e.g., with hand tools), or swapped out for a different type of electronics or updated hardware for the same type of electronics.

In various embodiments, junction box 310 can include a housing for an electrical connection between busbars of the laminate and conductive posts or rails of the junction box, which in turn can be coupled to one or more cables housing conductors, such as a single cable 312 as shown in FIG. 3.

In some embodiments, cable 312 can be mechanically attached to the junction box as opposed to being plugged in to the junction box. In one particular example, cable 312 and junction box 310 can be formed as part of a single injection molded part. In other embodiments, junction box 310 can include a female receptacle such that cable 312 can be plugged in to junction box 310.

FIG. 4 illustrates a cross-sectional view of example junction box 310 along axis A-A. The illustrated junction box includes a plurality of conductive posts 430, each of which can be electrically coupled to a respective busbar, such as busbar 208a as shown. Also shown, junction box 310 can include lid 311 that can serve as an enclosure to cover the electrical connection and inhibit moisture infiltration.

FIG. 5 illustrates a view of example junction box 310 as viewed from the backside of the PV module without lid 310. As illustrated, junction box 310 can include a number of rails, such as rails 510a, 510b, 510c, and 510d, which are configured to provide a conductive path between the PV cells and cable 312 via busbars 208a, 208b, 208c, and 208d. In the illustrated example, the coupling from busbar to rail is completed by tightening a screw to secure the busbar in contact with conductive post 430 of the rail. In other embodiments, other coupling techniques can be used, such as soldering, welding, spring clamping, other types of clamping, mechanical fasteners, etc.

In the illustrated embodiment, a first rail (e.g., rail 510a) is coupled to one of the busbars (e.g., 208a), a second rail (e.g., rail 110b) is coupled to another ones of busbars (e.g., 208b), and so on. The illustrated example shows four busbars coupled to a four-conductor cable but in other embodiments, a ratio other than 1:1 may be used. Moreover, as noted above, in some embodiments, additional or fewer busbars and/or additional or fewer conductors in the cable may be used.

Turning back to FIG. 3, cable 312 can include plug 314, which may also be used interchangeably with the term connector, on one end to plug in to electronics enclosure 320. Although shown in this configuration as a single plug on one end and a formed attachment on the other end, in some embodiments, cable 312 can include plugs on both ends with one end configured to plug in to the junction box and the other end configured to plug in to the electronics enclosure. Or, in one embodiment, cable 312 can be mechanically attached to the electronics enclosure, for example, formed as part of a single injection molded part with electronics enclosure 320 and cable 312 can include a plug used to plug in to junction box 310. Thus, in various embodiments, cable 312 used to electrically couple junction box 310 and electronics enclosure 320 can have no plugs and be directly coupled to the conductive posts of both the junction box and the electronics enclosure, or cable 312 can have one or more plugs as described above. Moreover, in some examples, a single junction box can connect to multiple electronics enclosures (whether on the same PV module or across multiple PV modules) or a single electronics enclosure can connect to multiple junction boxes across multiple PV modules. In such examples, any variation on the number of plugs can be used.

Figure 6:
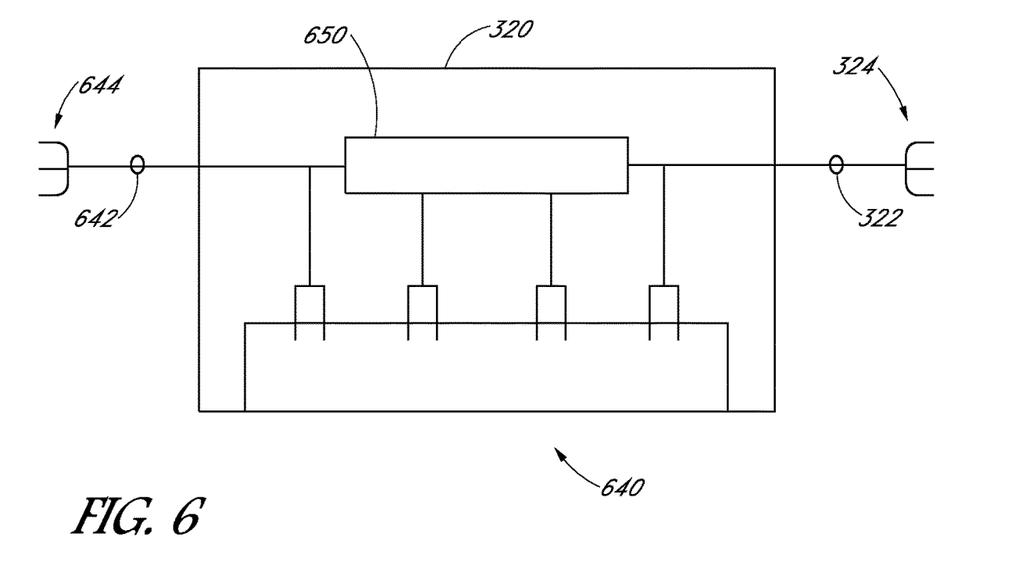
FIG. 6 illustrates an example electronics enclosure and associated components, according to some embodiments.

In various embodiments, electronics enclosure 320 can include electronic circuitry with the electronic circuitry being coupled to the conductors of cable 312. FIG. 6 illustrates an example diagram of electronics enclosure 320. As shown, electronics enclosure 320 can include electronic circuitry 620. Electronics enclosure and electronic circuitry and associated components can be referred to collectively as an electronics module or device. Electronic circuitry 620 can include microinverter circuitry configured to convert direct current (DC) from the PV module to alternating current (AC), voltage clipping circuitry, bypass circuitry (e.g., one or more bypass diodes configured to provide reverse bias protection to the PV module), DC-DC converter circuitry, DC-DC optimizer circuitry, differential power processing (DPP) circuitry, and/or monitoring circuitry, among other examples. Moreover, in some instances, electronic circuitry 620 can include multiple instances of the example circuitry above. For example, in one embodiment, electronics enclosure 320 can include multiple DC-DC converters as electronic circuitry 620.

As used herein, voltage clipping circuitry can be a voltage limiting device such that the circuitry is configured to remove at least a portion of the voltage output from the PV module. In one embodiment, the voltage clipping circuitry can include a parallel current path provided across one or more of the cell strings such that the output of the respective cell string can be included or excluded from the output of the PV module, for example, based on the configuration of one or more switches. The parallel current path can be configured to lower the total impedance on the cell string's output, which can lower the generated voltage of the PV module. In embodiments, the parallel current path can be provided across the entire PV module, a plurality of cells, a plurality of strings, or plurality of modules, to achieve a similar effect.

Also illustrated in FIG. 6, electronics enclosure can include receptacle 640, such as a female receptacle that can receive plug 314 of cable 312. FIG. 6 illustrates four conductors coupled to electronic circuitry 650 but as noted, in other embodiments, other numbers of conductors can be used. Note that in similar fashion, the junction box can include a female receptacle to receive a plug of cable 312 if the cable is not mechanically attached to the junction box.

Because the laminate and junction box configuration can be universal and used with a variety of different electronics enclosures and associated circuitry, in some embodiments, cable 312 may be designed for flexibility in number of conductors actually needed by the particular electronics circuitry. For instance, consider the following example in which one type of electronic circuitry may only need to use three conductors from the laminate whereas another type may need to use five conductors. Accordingly, in one embodiment, the busbars, junction box, and cable may be designed to accommodate the maximum number of conductors the electronics may require, five conductors in this example, but configured such that either of those electronics circuitry can work with the same busbar, junction box, and cable configuration allowing the electronics that only needs three conductors. The additional conductors may go unused (e.g., plugged in to the electronics enclosure but just not connected to anything) or may be jumpered together if need be (e.g., within the enclosure, outside the enclosure using a plug adapter piece).

Referring again to FIGS. 3 and 6, in various embodiments, electronics enclosure 320 can also be coupled to one or more other cables, such as cable 322 and/or cable 642, which in some instances, can include plug/connector 324 and/or 644, respectively. Cables 322 and/or 642 can be used to couple electronics enclosure 320 to an electronics enclosure or junction box of another PV module or to some other component of a PV system, such as a combiner box, inverter, etc. Similar to the description above regarding number of plugs per cable, cables 322 and/or 642 can be formed with electronics enclosure 320 as part of a single injection molded part or it can simply be plugged in to electronics enclosure 320.

In various embodiments, plugs and receptacles of the junction box and/or electronics enclosure can be configured to lock into place for a secure electrical connection and to inhibit moisture and/or dirt infiltration.

Figure 7:
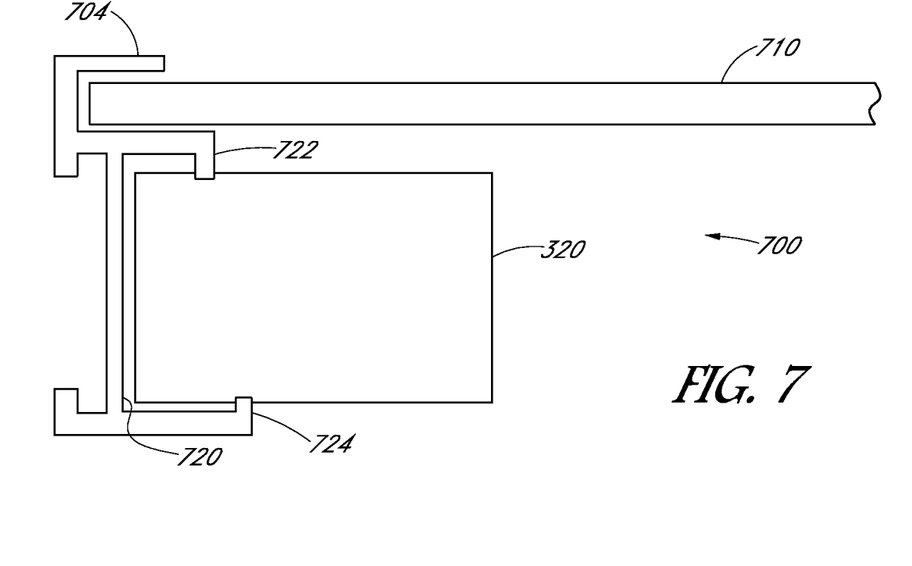
FIG. 7 illustrates a cross-sectional side view of a PV module, according to some embodiments.

In various embodiments, electronics enclosure can be field replaceable such that the electronics enclosure is relatively easily and reliably replaceable outside of the module manufacturing facility. This is contrast to a scenario in which the electronics enclosure is permanently attached to the backsheet with a sealant such as silicone rubber, as is typically the case for junction boxes, which would not be easily or reliability detached and replaced in the field without damaging the laminate (e.g., damaging the backsheet). Field replace-ability can enable replacement of faulty electronics or to switch out the electronics, whereas if the electronics were not easily replaceable, the electronics would need to be fixed in the field or the costly scenario of returning the entire PV module to the manufacturing facility for servicing, if even possible. FIG. 7 illustrates one such example of attaching electronics enclosure to the frame of a PV module such that it is releasably coupled to the frame and field replaceable.

FIG. 7 is cross-sectional size view of a PV module 700, according to some embodiments. As explained herein, frame 704 can be disposed about the periphery of PV module 700 and can support PV laminate 710. As shown in FIG. 7, electronics enclosure 320 can be positioned beneath laminate 710 and coupled to the frame 704.

As shown, electronics enclosure 320 can be attached to frame 704 by way of mounting recess 720. As shown in FIG. 7, mounting recess can include first projection 722 and second projection 724 extending from opposite sides of the mounting recess. The first and second projections can be spaced to accommodate a variety of sizes of electronics enclosures yet allow for a tight engagement (e.g., snap fit) between the projections and the electronics enclosure.

Further, although described as a recess with projections, in other embodiments, the frame can include one or more slots or holes to which the electronics enclosure can be coupled to or to which a bracket or clip can be attached and used to couple to the electronics enclosure. Moreover, in some embodiments, as described herein, the frame can include holes through which screws or other fasteners can be used to couple the electronics enclosure to the frame.

Although the electronics enclosure is described throughout much of the application as being coupled to the frame of the PV module, in some embodiments, the electronics enclosure can be coupled to balance of system ("BOS") components of the overall PV system. As one example, the PV module itself could be a glass/glass module without a frame and therefore may not have a frame to couple the electronics enclosure to. In such an example, the electronics enclosure(s) can be coupled to an inverter, racking components, combiner box, among other examples.

Figure 8:
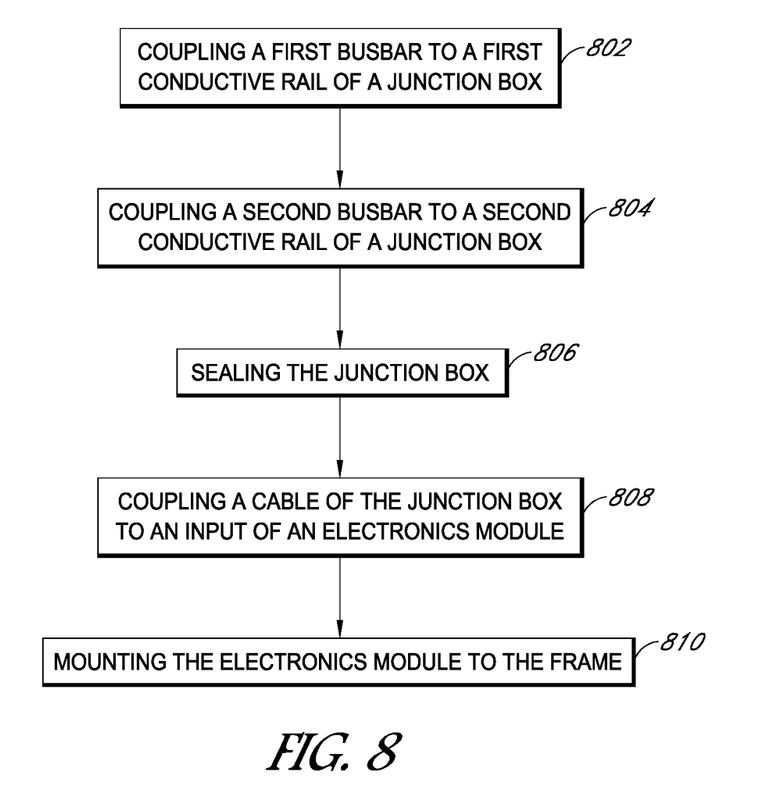
FIG. 8 illustrates a flowchart of an example method for fabricating a PV module, according to some embodiments.

Turning now to FIG. 8, a flow chart illustrating a method for assembling a PV module is shown, according to some embodiments. In various embodiments, the method of FIG. 8 may include additional (or fewer) blocks than illustrated.

As shown at 802, a first busbar configured to receive current from a first string of photovoltaic cells of a photovoltaic module can be coupled to a first conductive rail of a junction box coupled to the backsheet of the photovoltaic module. And as shown at 804, a second busbar configured to receive current from a second string of photovoltaic cells of a photovoltaic module can be coupled to a second conductive rail of the junction box. In various embodiments, coupling the busbars to the conductive rails can include welding, soldering, or clamping (e.g., spring clamping) the busbars to a respective conductive rail.

Note that different quantities of busbars, conductive posts, and conductors can be used in various embodiments. For instance, in many examples throughout, a PV module using four busbars is described. In other embodiments, other quantities of busbars and corresponding conductive rails can be used. Accordingly, if more than two busbars and conductive rails are used, then the method of assembling the PV module can include coupled those additional busbars to the additional conductive rails.

At 806, the junction box can be sealed. For example, the junction box can be potted or otherwise sealed to inhibit moisture and/or dirt ingress.

In various embodiments, one or more cables of the junction box can provide an insulating sheath around a plurality of conductors, and can be configured to be coupled to the conductive rails of the junction box and to an electronics module that is mountable to a frame of the photovoltaic module.

In one embodiment, a single cable can be used to encase the plurality of conductors from the junction box to the electronics module. Or in other embodiments, multiple cables can be used to encase the plurality of conductors As shown at 808, the single or multiple cables can be coupled to an input of the electronics module such that an electrical connection is made to electronic circuitry inside the electronics module.

In some embodiments and, as shown at block 810 and illustrated at FIGS. 3 and 7, the electronics module can be mounted to the frame. As one example, the electronics module can be placed in a bracket, mounting receptacle, or other fitting to securely attach (e.g., snap fit) the electronics module to the frame. As another example, the electronics module can be screwed or bolted to the frame.

In one embodiment, the electronics module can be electrically bonded to the frame. As one specific example, the electronics module can be grounded to the frame.

In some embodiments, mounting the electronics module at block 810 can be performed before the cable or cables are coupled to the electronics module at 808.

In some embodiments, the electronics module and enclosure can be fabricated in a similar manner. For example, conductive leads in the electronic circuitry can be electrically coupled to conductors of one or more cables fabricated as an integrated part of the electronics enclosure, or the conductive leads in the electronic circuitry can be electrically coupled to a conductive pin of a receptacle of the electronics enclosure such that a cable with a plug can plug in to the electronics enclosure and establish electrical continuity.

The disclosed embodiments can offer many advantages as described throughout. For example, by providing a universal laminate that is capable of interfacing with a variety of electronics, electronics can be plug-and-play and can even be replaced in the field to effectively extend the life of the PV module. Moreover, by providing a minimal junction box and attaching the electronics to the frame, the weight and stress on the backsheet, which can weaken over time, can be minimized. Additionally, production planning and logistics can be simplified as denser shipping of laminates can be enabled as well as not having to duplicate processes for many different types of modules. Instead, the laminate and module fabrication process can be the same up to the point where electronics is plugged in and attached to the frame.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A photovoltaic module, comprising:
   a photovoltaic laminate;
   a frame coupled to a perimeter of the photovoltaic laminate;
   a junction box coupled to the photovoltaic laminate, wherein the junction box includes a housing for an electrical connection between a plurality of solar cells of the photovoltaic laminate and a plurality of conductors,
   an electronics enclosure releasably coupled directly to the frame by a mounting recess and one or more projections extending from one or more respective sides of the mounting recess in a direction orthogonal to a backside of the photovoltaic laminate,
   wherein the one or more projections are spaced to couple the electronics enclosure to the frame via a tight engagement between the projections and the electronics enclosure;
   wherein the electronics enclosure includes electronic circuitry including one or more bypass diodes configured to provide reverse bias protection to the photovoltaic module,
   wherein the electronic circuitry is electrically coupled to the plurality of conductors and to another photovoltaic module, and
   wherein, from a plan view perspective with the frame over the electronics enclosure, the frame covers a portion of but not all of the electronics enclosure.

2. The photovoltaic module of claim 1, wherein the plurality of conductors are contained within a cable that is mechanically attached to the junction box, wherein the cable includes a plug configured to plug in to the electronics enclosure.

3. The photovoltaic module of claim 2, wherein the junction box and the cable are part of a single injection molded part.

4. The photovoltaic module of claim 1, wherein the plurality of conductors are contained within a cable that is mechanically attached to the electronics enclosure, wherein the cable includes a plug configured to plug in to a receptacle of the junction box.

5. The photovoltaic module of claim 1, wherein the plurality of conductors are contained within a cable having plugs at both ends, wherein one plug is configured to plug in to the junction box and the other plug is configured to plug in to the electronics enclosure.

6. The photovoltaic module of claim 1, wherein the electronic circuitry is configured to convert direct current (DC) from the photovoltaic module to alternating current (AC).

7. The photovoltaic module of claim 1, wherein the electronic circuitry is configured to remove at least a portion of a voltage output from the photovoltaic module.

8. The photovoltaic module of claim 1, wherein the electronic circuitry is electrically coupled to another photovoltaic module via another cable that is directly coupled to a junction box of the other photovoltaic module.

9. The photovoltaic module of claim 1, wherein the electronics enclosure is grounded to the frame.

10. The photovoltaic module of claim 1, wherein the electronics enclosure is coupled to the frame via a snap-fit receptacle of the frame located under the photovoltaic laminate.

11. The photovoltaic module of claim 1, wherein the one or more projections comprise a first projection and a second projection, the first projection and the second projection extending from opposite sides of the mounting recess.

12. The photovoltaic module of claim 1, wherein the one or more projections are spaced to accommodate a variety of sizes of electronics enclosures.

13. A photovoltaic module, comprising:
    a plurality of solar cells arrayed in a plane;
    a frame disposed about the periphery of the photovoltaic module;
    a junction box comprising a single output cable and a plurality of conductive posts; and
    a plurality of ribbons coupling the plurality of solar cells to the output cable via the plurality of posts, wherein the single output cable is configured to couple to an electronics module releasably mountable directly to the frame of the photovoltaic module by an interior mounting recess and one or more projections extending from one or more respective sides of the mounting recess in a direction orthogonal to the plane of the plurality of solar cells,
    wherein the one or more projections are spaced to couple the electronics enclosure to the frame via a tight engagement between the projections and the electronics enclosure;
    wherein the electronics module comprises electronic circuitry including one or more bypass diodes configured to provide reverse bias protection to the photovoltaic module, and
    wherein, from a plan view perspective with the frame over the electronics module, the frame covers a portion of but not all of the electronics module.

14. The photovoltaic module of claim 13, further comprising the electronics module coupled to the frame and the single output cable coupled to an input of the electronics module.

15. The photovoltaic module of claim 14, wherein the electronics module is field replaceable.

16. The photovoltaic module of claim 15, wherein the electronics module is field replaceable to a different type of electronics module.

17. The photovoltaic module of claim 14, wherein an electronic circuit within the electronics module is grounded to the frame.

18. The photovoltaic module of claim 14, wherein the electronics module is coupled to the frame via a snap-fit receptacle of the frame located under a photovoltaic laminate of the plurality of solar cells.

19. A photovoltaic module, comprising:
a photovoltaic laminate;
a frame coupled to a perimeter of the photovoltaic laminate;
a junction box coupled to the photovoltaic laminate, wherein the junction box includes a housing for an electrical connection between a plurality of solar cells of the photovoltaic laminate and a plurality of conductors, the housing being permanently fixed to the laminate,
an electronics enclosure releasably coupled directly to the frame by a mounting recess and one or more projections extending from one or more respective sides of the mounting recess in a direction orthogonal to a backside of the photovoltaic laminate,
wherein the one or more projections are spaced to couple the electronics enclosure to the frame via a tight engagement between the projections and the electronics enclosure;
wherein the electronics enclosure includes electronic circuitry including one or more bypass diodes configured to provide reverse bias protection to the photovoltaic module,
wherein the electronic circuitry is electrically coupled to the plurality of conductors and to another photovoltaic module.

20. The photovoltaic module of claim 19, wherein the plurality of conductors are contained within a cable that is mechanically attached to the junction box, wherein the cable includes a plug configured to plug in to the electronics enclosure.

21. The photovoltaic module of claim 20, wherein the junction box and the cable are part of a single injection molded part.

* * * * *